(12) United States Patent
Niu et al.

(10) Patent No.: US 11,809,957 B2
(45) Date of Patent: Nov. 7, 2023

(54) THREE QUBIT ENTANGLING GATE THROUGH TWO-LOCAL HAMILTONIAN CONTROL

(71) Applicant: Google LLC, Mountain View, CA (US)

(72) Inventors: Yuezhen Niu, El Segundo, CA (US); Vadim Smelyanskiy, Mountain View, CA (US); Sergio Boixo Castrillo, Rancho Palos Verdes, CA (US)

(73) Assignee: Google LLC, Mountain View, CA (US)

( * ) Notice: Subject to any disclaimer, the term of this patent is extended or adjusted under 35 U.S.C. 154(b) by 384 days.

(21) Appl. No.: 16/981,606

(22) PCT Filed: Jan. 31, 2019

(86) PCT No.: PCT/US2019/016047
§ 371 (c)(1),
(2) Date: Sep. 16, 2020

(87) PCT Pub. No.: WO2020/106313
PCT Pub. Date: May 28, 2020

(65) Prior Publication Data
US 2021/0390442 A1 Dec. 16, 2021

Related U.S. Application Data

(60) Provisional application No. 62/769,398, filed on Nov. 19, 2018.

(51) Int. Cl.
*G06N 10/00* (2022.01)
*H10N 60/12* (2023.01)

(52) U.S. Cl.
CPC ............ *G06N 10/00* (2019.01); *H10N 60/12* (2023.02)

(58) Field of Classification Search
CPC ................ G06N 10/00; H10N 60/12
(Continued)

(56) References Cited

U.S. PATENT DOCUMENTS

| 10,593,879 B2* | 3/2020 | Schrade | H10N 60/128 |
| 2008/0107273 A1* | 5/2008 | Munro | H04L 9/0858 |
| | | | 380/278 |

(Continued)

OTHER PUBLICATIONS

Notice of Allowance in Canada Appln. No. 3,096,026, dated Oct. 20, 2022, 1 page.
(Continued)

*Primary Examiner* — Suchin Parihar
(74) *Attorney, Agent, or Firm* — Fish & Richardson P.C.

(57) ABSTRACT

Methods, systems and apparatus for implementing a quantum gate on a quantum system comprising a second qubit coupled to a first qubit and a third qubit. In one aspect, a method includes evolving a state of the quantum system for a predetermined time, wherein during evolving: the ground and first excited state of the second qubit are separated by a first energy gap $\omega$; the first and second excited state of the second qubit are separated by a second energy gap equal to a first multiple of $\omega$ minus qubit anharmoniticity-$\eta$; the ground and first excited state of the first qubit and third qubit are separated by a third energy gap equal to $\omega - \eta$; and the first and second excited state of the first qubit and third qubit are separated by a fourth energy gap equal to the first multiple of the $\omega$ minus a second multiple of $\eta$.

30 Claims, 3 Drawing Sheets

(58) Field of Classification Search
USPC .......................................................... 716/100
See application file for complete search history.

(56) References Cited

U.S. PATENT DOCUMENTS

| | | | | |
|---|---|---|---|---|
| 2017/0116542 | A1* | 4/2017 | Shim | G06N 10/00 |
| 2019/0214561 | A1* | 7/2019 | Schrade | H10N 99/03 |
| 2020/0394544 | A1* | 12/2020 | Low | G16C 10/00 |
| 2022/0014192 | A1* | 1/2022 | Ahonen | G06N 10/00 |
| 2022/0292381 | A1* | 9/2022 | Bravyi | G06F 30/20 |

OTHER PUBLICATIONS

Notice of Allowance in European Appln. No. 19705668.2, dated May 2, 2023, 9 pages.
Office Action in European Appln. No. 19705668.2, dated Apr. 5, 2022, 4 pages.
Office Action in European Appln. No. 19705668.2, dated Nov. 21, 2022, 4 pages.
Oral Proceedings in European Appln. No. 19705668.2, dated Aug. 31, 2022, 2 pages.
PCT International Preliminary Report on Patentability in International Application No. PCT/US2019/016047, dated Mar. 3, 2021, 7 pages.
Barenco et al., "Stabilization of quantum computations by summarization," SIAM Journal on Computing, Oct. 1997, 26(5):1541-57.
Barnes et al., "Fast microwave-driven three-qubit gates for cavity-coupled superconducting qubits," , Jul. 2017.
Boixo et al., "Characterizing quantum supremacy in near-term devices," Nature Physics, Jun. 2018, 14(6):595-600.
Chau et al., "Simple realization of the Fredkin gate using a series of two-body operators," Physical review letters, Jul. 1995, 75(4):748.
Deng et al., "Robustness of error-suppressing entangling gates in cavity-coupled transmon qubits," Physical Review B., Jul. 2017, 96(3):035441.
DiVincenzo et al., "Quantum computation," Science, Oct. 1995, 270(5234):255-61.
Fredkin et al., "Conservative logic. International Journal of theoretical physics," Apr. 1982, 21(3-4):219-53.
Gerry et al., "Generation of maximally entangled photonic states with a quantum-optical Fredkin gate," Physical Review A., Nov. 2001, 64(6):063814.
Neill et al., "A blueprint for demonstrating quantum supremacy with superconducting qubits," Science, Apr. 2018, 360(6385):195-9.
Nielsen et al., "Quantum computation and quantum information," Cambridge University Press, 2002.
PCT International Search Report and Written Opinion in International Appln. No. PCT/US2019/016047, dated Aug. 19, 2019, pages.
Roy et al., "Multi-mode superconducting circuits for realizing stringly coupled multi-qubit processor units," Physical Review A., Aug. 2018, 98(5):052318.
Shi et al., "Both Toffoli and controlled-NOT need little help to do universal quantum computation," arXiv preprint quant-ph0205115, May 2002.
Smolin et al., "Five two-bit quantum gates are sufficient to implement the quantum Fredkin gate," Phys. Rev. A, Apr. 1996, 53:2855.
Zahedinejad et al., "Designing High-Fidelity Single-shot three-qubit gates: a machine learning approach," Institute for Quantum Information and Matter, Nov. 2016, 18 pages.
EP Office Action in European Application No. 19705668.2, dated Oct. 11, 2021, 7 pages.
EP Office Action in European Application No. 19705668.2, dated Oct. 22, 2021, 7 pages.

* cited by examiner

THREE QUBIT ENTANGLING GATE THROUGH TWO-LOCAL HAMILTONIAN CONTROL

CROSS-REFERENCE TO RELATED APPLICATIONS

This application is a National Stage Application under 35 U.S.C. § 371 and claims the benefit of International Application No. PCT/US2019/016047, filed Jan. 31, 2019, which claims priority to U.S. Application No. 62/769,398, filed Nov. 19, 2018, the disclosure of which is incorporated herein by reference.

BACKGROUND

This specification relates to quantum computing.

Classical computers have memories made up of bits, where each bit can represent either a zero or a one. Quantum computers maintain sequences of quantum bits, called qubits, where each quantum bit can represent a zero, one or any quantum superposition of zeros and ones. Quantum computers operate by setting qubits in an initial state and controlling the qubits, e.g., according to a sequence of quantum logic gates.

SUMMARY

This specification describes control strategies for implementing three-qubit entangling gates using two-local Hamiltonian control.

In general, one innovative aspect of the subject matter described in this specification can be implemented in a method for implementing a three-qubit quantum gate on a quantum system comprising a first qubit, second qubit and third qubit, wherein the second qubit is coupled to the first qubit and to the third qubit, the method comprising: evolving a state of the quantum system under a Hamiltonian describing the quantum system for a predetermined time, wherein during the evolving: the ground and first excited state of the second qubit are separated by a first energy gap; the first and second excited state of the second qubit are separated by a second energy gap that is equal to a first multiple of the first energy gap minus qubit anharmoniticity; the ground and first excited state of the first qubit and ground and first excited state of the third qubit are separated by a third energy gap that is equal to the first energy gap minus the qubit anharmonicity; and the first and second excited state of the first qubit and first and second excited state of the third qubit are separated by a fourth energy gap that is equal to the first multiple of the first energy gap minus a second multiple of the qubit anharmonicity.

Other implementations of these aspect include corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. The first multiple of the first energy gap may be equal to twice the energy gap. The second multiple of the qubit anharmonicity may be equal to three times the qubit anharmonicity.

The method may further comprise applying multiple Pauli Z rotations to the evolved state of the quantum system to cancel additional phase accumulated in the computational basis during evolution of the state of the quantum system. Applying multiple Pauli Z rotations may comprise applying the operator $$e^{-\frac{i(\omega-\eta)\Delta t}{2}\sigma_1^z}e^{-\frac{i(\omega)\Delta t}{2}\sigma_2^z}e^{-\frac{i(\omega-\eta)\Delta t}{2}\sigma_3^z}$$

to the evolved state of the quantum system.

The coupling between the first and second qubit and between the second and third qubit may be homogeneous. The predetermined time may be equal to $\pi/2g$ where g represents qubit coupling strength. Implementing the three-qubit gate may comprise: performing a swap operation between the first qubit and the third qubit, the swap operation being conditioned on the second qubit being in an excited stat, and assigning a minus sign to swapped basis states.

The coupling between qubits may be inhomogeneous. The predetermined time may be equal to $\pi/2g$ with $$g = \sqrt{\frac{g_1^2 + g_2^2}{2}}$$

where $g_1$ represents coupling strength between the first qubit and second qubit, and $g_2$ represents coupling strength between the second qubit and third qubit. Implementing the three-qubit gate may comprise: performing a partial swap operation between the first qubit and the third qubit, the parital swap operation being conditioned on the second qubit being in an excited state, and assigning a minus sign to swapped basis states.

The qubit anharmonicity may be equal to more than one magnitude larger than the strength of the coupling between the first and second qubit and larger than the strength of the coupling between the second and third qubit.

The first qubit, second qubit and third qubit may comprise superconducting qubits. The second qubit may be coupled to the first qubit and to the third qubit via inductive, capacitive or both inductive and capacitive coupling. Nonlinear Josephson junctions may be positioned between the first and second qubit and between the second and third qubit.

The Hamiltonian describing the quantum system may be given by $$\hat{H}_3 = -\frac{\eta}{2}\Sigma_{j=1}^3 \hat{n}_j(\hat{n}_j - 1) + \Sigma_{j=1}^3 \omega_j(t)\hat{n}_j + g_1(t)(\hat{a}_1\hat{a}^\dagger_2 + \hat{a}^\dagger_1\hat{a}_2) + g_2(t)(\hat{a}_2\hat{a}^\dagger_3 + \hat{a}^\dagger_2\hat{a}_3)$$

where η represents qubit anharmonicity, $\omega_j(t)$ represents qubit frequency, and g(t) represents two-qubit coupling strength.

The qubit anharmonicity may be equal to 200 MHz. The strength of the coupling between the first and second qubit or between the second and third qubit takes values in the range [−5 MHz, 50 MHz]. The first, second, third, or fourth energy gaps may take values in the range [4.0 GHz, 6.0 GHz].

The subject matter described in this specification can be implemented in particular ways so as to realize one or more of the following advantages.

A system implementing three-qubit entangling gates using the techniques described in this specification can provide an improvement in experimental control resource requirements compared to other techniques, e.g., those that decompose computations into 15 quantum gates selected from universal gate set that includes arbitrary single qubit gates and controlled single qubit gates. For example, the presently described techniques only require a single round of continuous controls over the frequency of each qubit to implement a three-qubit gate with maximal Schmidt rank between any two of the three qubits. This reduces the required runtime of the gate implementation, and increases the computation capacity of a quantum device implementing the gate. In addition, a superconducting system implementing the presently described techniques does not require the use of microwave controls. Avoidance of microwave controls can reduce incurred leakage errors and mitigate the high synchronization requirement in simultaneous control of microwave and qubit frequency. Furthermore, the presently described three-qubit controlled swap gate has a wide range of applications in any quantum algorithms that require non-local controlled unitary evolution. The presently described techniques therefore can enable the realization of quantum devices and improve the performance and functionality of such devices.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Overview

Quantum algorithms can be represented by quantum circuits that include a set of universal instructions, i.e., universal quantum gates. One example universal gate set includes the Hadamard gate, S gate, T gate, and the two-qubit entangling controlled-not (CNOT) gate. Another example universal gate set includes a single three-qubit Fredkin gate and the Hadamard gate. The Fredkin gate was first proposed as a universal gate for classical reversible computation and has been applied in settings such as quantum error correction and for preparing maximally entangled quantum states. The action of a Fredkin gate can be described as swapping the states of a first and third qubit conditioned on the second qubit being in the 1 state.

For the near-term application of quantum computers, one major focus is to minimize the experimental resources necessary for building a useful quantum circuit from elementary quantum gates. Implementing quantum circuits using a universal gate set that includes the Fredkin gate reduces the size of the minimal universal gate set—which in turn reduces experimental overhead in calibrating and controlling each different gate—and can also reduce the required circuit depth for various quantum algorithms that require non-local controls, e.g., quantum phase estimation and quantum Fourier transforms. However, Fredkin gates are costly to implement. For example, a minimal of five arbitrary non-local two-qubit gates are necessary to construct a single Fredkin gate. As another example, a minimum of fifteen qubit gates selected from the universal set {CNOT, Hadamard, T gate and S gate} are required to construct a single Fredkin gate.

This specification describes systems and methods for implementing a three-qubit gate, referred to herein as a "CSZ" gate, using qubit frequency detunings. The CSZ gate is equivalent to a quantum Fredkin gate up to two-qubit CZ gates and shares the same Schmidt rank as Fredkin gate, but requires less resources to implement. The CSZ gate implements a full or partial swap operation on a first and third qubit conditioned on the second qubit being in the first excited state, and assigns a minus sign to the swapped bases. The proposed CSZ gate is universal together with the Hadamard gate.

Example Operating Environment

Figure 1:
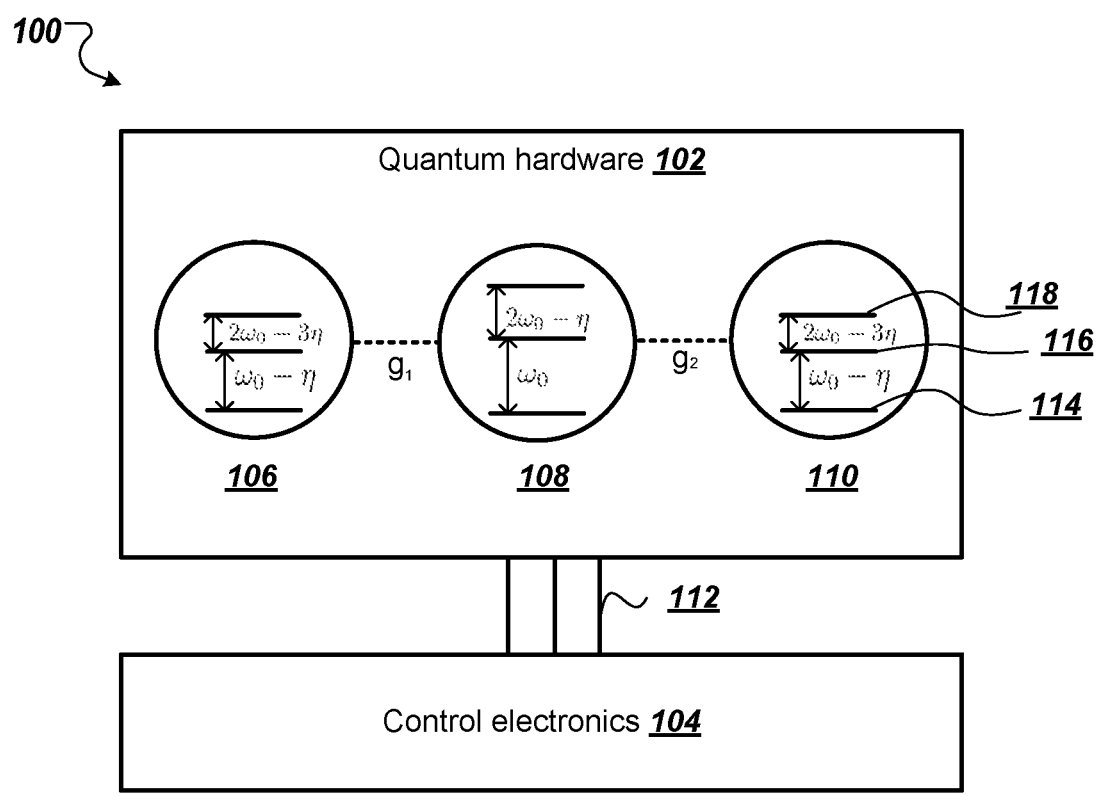
FIG. 1 depicts an example system for implementing three-qubit gates with local Hamiltonian control.

FIG. 1 is an example system 100 for implementing a CSZ three-qubit gate with two-local Hamiltonian control. The system 100 includes quantum hardware 102 that includes at least a first qubit 106, a second qubit 108, and a third qubit 110. The first qubit 106, second qubit 108, and third qubit 110 may be subcomponents of the quantum hardware 102. For example, quantum hardware 102 may include additional components for performing quantum or classical computations, e.g., additional qubits, additional qubit couplers, additional control electronics and processors.

Each of the first qubit 106, second qubit 108, and third qubit 110 are frequency-tunable. Tuning the frequency of a respective qubit adjusts the energies of the states of the qubit. Each qubit includes two computational states $|0\rangle$ and $|1\rangle$ and one or more non-computational states $|2\rangle$, $|3\rangle$, etc. Transitions from computational states to a non-computational state are unwanted and referred to as leakage, and can reduce the fidelity of a computation being performed by the qubits. Amongst the possible unwanted transitions, transitions from a computational state to the non-computational state $|2\rangle$ may be most likely to occur. Therefore, for convenience, the first three levels, e.g., levels 114, 116, 118, corresponding to states $|0\rangle$, $|1\rangle$, $|2\rangle$ of the first qubit 106, second qubit 108 and third qubit 110 are illustrated in FIG. 1. The states of each qubit are separated by respective energy gaps (differences in frequency), as described in more detail below.

In some implementations the first qubit 106, second qubit 108 and the third qubit 110 may be superconducting qubits. For example, the first qubit 106, second qubit 108 and the third qubit 110 may be transmon qubits. In other implementations other qubit architectures may be used instead. As described below, the first qubit 106, second qubit 108 and third qubit 110 have an associated qubit anharmonicity measured in MHz.

The first qubit 106, second qubit 108 and third qubit 110 are arranged as a one dimensional chain with nearest neighbor couplings. The second qubit 108 is coupled to the first qubit 106 with a coupling strength $g_1(t)$, which may be measured in MHz. The second qubit 108 is also coupled to the third qubit 110 with a coupling strength $g_2(t)$, which may be measured in MHz. As described in more detail below, in some implementations the qubit coupling may be homogeneous, i.e., $g_1(t)=g_2(t)=(t)$ In other implementations the qubit coupling may be inhomogeneous, i.e., $g_1(t) \neq g_2(t)$.

The type of coupling used by the system 100 is dependent on the chosen qubit architectures. For example, in cases where the qubits 106-110 are superconducting qubits, the coupling may include capacitive, inductive, or a combination of inductive and capacitive coupling. Inductive and capacitive couplings may be achieved through intermediate nonlinear Josephson junctions positioned between neighboring qubits, i.e., positioned between the first and second qubit and between the second and third qubit.

In some implementations a Hamiltonian describing the three qubit subsystem (a system including the first qubit 106, second qubit 108 and third qubit 110) included in the quantum hardware 102 may be given by Equation (1) below.

$$\hat{H}_3 = -\frac{\eta}{2}\Sigma_{j=1}^{3}\hat{n}_j(\hat{n}_j - 1) + \Sigma_{j=1}^{3}\omega_j(t)\hat{n}_j + \quad (1)$$
$$g_1(t)(\hat{a}_1\hat{a}^\dagger_2 + \hat{a}^\dagger_1\hat{a}_2) + g_2(t)(\hat{a}_2\hat{a}^\dagger_3 + \hat{a}^\dagger_2\hat{a}_3)$$

In Equation (1), $\eta$ represents qubit anharmonicity, $\omega_j(t)$ represents qubit frequency (the harmonic part of the energy), and $g(t)$ represents the two-qubit coupling strength. In some implementations the qubit anharmonicity $\eta$ may be approximately equal to 200 MHz, i.e., within the limits of hardware accuracy, $g(t)$ takes values in the range [−5 MHz, 50 MHz] and $\omega_j(t)$ takes values in the range [4.0 GHz, 6.0 GHz].

As described in more detail below, during execution of the CSZ three-qubit gate described in this specification, the qubits are "parked in frequency" according to a particular frequency configuration given below in Table II. That is, during execution of the CSZ three-qubit gate described in this specification, the frequencies of the first qubit 106, second qubit 108 and third qubit 110 are tuned such that the states $|0\rangle$, $|1\rangle$, $|2\rangle$ of the first qubit 106, second qubit 108 and third qubit 110 are separated by energy gaps specified by Table II below.

The system 100 includes control electronics 104. Control electronics 104 includes control devices that may operate the quantum hardware. For example, control electronics 104 may include an arbitrary waveform generator, e.g., a digital to analog converter (DAC) and various frequency filters. In some cases each qubit may use one DAC channel for the frequency control line to provide dynamic frequency modulation.

The system 100 includes one or more qubit control lines 112 from the control electronics 104 to the quantum hardware 102. In some implementations the system 100 may include multiple control lines 112 that directly couple control devices in the control electronics 104 to respective qubits. The one or more qubit control lines 112 can be used to tune the frequency of the first qubit 106, second qubit 108 and third qubit 110. The frequency of the first qubit 106, second qubit 108 and third qubit 110 may be tuned by applying control signals to the qubit control lines 112 via the control electronics 104. For example, the control electronics 104 may apply voltage pulses to the qubit control lines 112 to tune the frequencies of the first qubit 106, second qubit 108 and third qubit 110.

In addition, control electronics 110 can perform measurements of the first qubit 106, second qubit 108 and third qubit 110 through the qubit control lines 112. Measurement of the first qubit 106, second qubit 108 and third qubit 110 determines the state of the first qubit 106, second qubit 108 and third qubit 110, respectively. Control electronics 110 can store, display, and/or further process the results of each of the measurements of the first qubit 106, second qubit 108 and third qubit 110.

Although not illustrated in FIG. 1, the control electronics 110 may include a data processing apparatus and associated memory. The memory may include a computer program having instructions that, when executed by the data processing apparatus, cause the data processing apparatus to perform one or more functions described herein, such as applying a control signal to a qubit and/or to a tunable coupler.

Three-Qubit Gate Frequency Parking

Homogeneous Coupling

In some implementations the coupling between the first and second qubit $g_1(t)$ and the coupling between the second and third qubit $g_2(t)$ is homogeneous, i.e., $g_1(t)=g_2(t)=g(t)$. In these implementations the magnitude of the coupling $g(t)$ may be smaller than the anharmonicity and qubit frequency, i.e., $g<<\eta$ and $g<<\omega_j$.

When the CSZ three-qubit gate is not being performed (the gate is "off"), the three qubits can be parked such that qubit states coupled under the two-qubit Hamiltonian in Equation (1) are separated by a large gap compared to the interaction strength. That is, the operating frequencies of each of the three qubits take values that are separated by a gap that is at least one magnitude larger than the respective two-qubit interaction strengths. An example configuration of parked qubit frequencies for when the three-qubit gate is off is given in Table I below.

TABLE I

Qubit frequency when the three-qubit gate is off,
with $\omega_1 < |\omega_2| > \omega_3$, $|\omega_1 - \omega_2 + \eta| >>$
g, $|\omega_3 - \omega_2 + \eta| >> g$, $|\omega_1 - \omega_2| >> g$ and $|\omega_2 - \omega_3| >> g$.

| | $\hat{a}_1$ | $\hat{a}_2$ | $\hat{a}_3$ |
|---|---|---|---|
| $|0\rangle$ | 0 | 0 | 0 |
| $|1\rangle$ | $\omega_1$ | $\omega_2$ | $\omega_3$ |
| $|2\rangle$ | $2\omega_1 - \eta$ | $2\omega_2 - \eta$ | $2\omega_3 - \eta$ |

In the single excitation subspace, to ensure that the states $|100\rangle$ and $|010\rangle$ are separated by a gap that is larger than the coupling strength $g(t)$ the qubit frequencies satisfy $|\omega_1-\omega_2|>>g$. To ensure that the states $|010\rangle$ and $|001\rangle$ are separated by a gap that is larger than the coupling strength $g(t)$ the qubit frequencies satisfy $|\omega_2-\omega_3|>>g$. In the two-excitation subspace, to ensure that the states $|110\rangle$ and $|020\rangle$ are separated by a gap that is larger than the coupling strength the qubit frequencies satisfy $|\omega_1-\omega_2+\eta|>>g$. Similarly, to ensure that the states $|020\rangle$ and $|011\rangle$ are separated by a gap that is larger than the coupling strength the qubit frequencies satisfy $|\omega_2-\omega_3+\eta|>>g$. In the three-excitation subspace the same properties as those in the two-excitation subspace ensure that the states $|120\rangle$, $|111\rangle$ and $|021\rangle$ are separated by a gap that is larger than the coupling strength.

Under the assumption that the first and third qubit share the same harmonic energy $\omega_3=\omega_1$, which can be assumed without loss of generality, the overall Hamiltonian in the basis of $\vec{v}=\{v_{110}, v_{020}, v_{011}, v_{120}, v_{111}, v_{021}\}$ which parameterizes the amplitude of the basis states $\{|110\rangle, |020\rangle, |011\rangle, |120\rangle, |111\rangle, |021\rangle\}$, takes the block diagonal form given by Equations (2)-(4) below.

$$\hat{H} = \begin{pmatrix} \eta+\omega_1-\omega_2 & \sqrt{2}g & 0 & 0 & 0 & 0 \\ \sqrt{2}g & 0 & \sqrt{2}g & 0 & 0 & 0 \\ 0 & \sqrt{2}g & \eta+\omega_1-\omega_2 & 0 & 0 & 0 \\ 0 & 0 & 0 & \omega_1 & \sqrt{2}g & 0 \\ 0 & 0 & 0 & \sqrt{2}g & \eta+2\omega_1-\omega_2 & \sqrt{2}g \\ 0 & 0 & 0 & 0 & \sqrt{2}g & \omega_1 \end{pmatrix} = \hat{H}_d + \hat{H}_{od} \quad (2)$$

$$\hat{H}_d \begin{pmatrix} \eta+\omega_1-\omega_2 & 0 & 0 & 0 & 0 & 0 \\ 0 & 0 & 0 & 0 & 0 & 0 \\ 0 & 0 & \eta+\omega_1-\omega_2 & 0 & 0 & 0 \\ 0 & 0 & 0 & \omega_1 & 0 & 0 \\ 0 & 0 & 0 & 0 & \eta+2\omega_1-\omega_2 & 0 \\ 0 & 0 & 0 & 0 & 0 & \omega_1 \end{pmatrix} \quad (3)$$

$$\hat{H}_{od} \begin{pmatrix} 0 & \sqrt{2}g & 0 & 0 & 0 & 0 \\ \sqrt{2}g & 0 & \sqrt{2}g & 0 & 0 & 0 \\ 0 & \sqrt{2}g & 0 & 0 & 0 & 0 \\ 0 & 0 & 0 & 0 & \sqrt{2}g & 0 \\ 0 & 0 & 0 & \sqrt{2}g & 0 & \sqrt{2}g \\ 0 & 0 & 0 & 0 & \sqrt{2}g & 0 \end{pmatrix} \quad (4)$$

In Equations (2)-(4) the energy $2\omega_0-\eta$ of state $|020\rangle$ is taken as reference for the diagonal values for all the bases, $\hat{H}_d$ represents the diagonal part of the Hamiltonian, and $\hat{H}_{od}$ represents the off-diagonal part of the Hamiltonian. This choice results in a global phase shift in the given subspace which can be corrected single Pauli rotations (described below).

To perform the CSZ three-qubit gate (to turn the gate "on"), the qubit frequencies are parked such that states $|110\rangle, |020\rangle, |011\rangle$ and $|120\rangle, |111\rangle, |021\rangle$ are degenerate under the diagonal Hamiltonian $\hat{H}_d$. This frequency parking reduces leakage when the three-qubit gate is turned on, and still ensures a large energy gap $\omega_0$ between the two subspaces $\mathcal{H}_1=\mathrm{SPAN}\{|110\rangle, |020\rangle, |011\rangle\}$ and $\mathcal{H}_2=\mathrm{SPAN}\{|120\rangle, |111\rangle, |021\rangle\}$. An example configuration of parked qubit frequencies for when the CSZ three-qubit gate is turned on is given in Table II below.

TABLE II

Qubit frequency for the three-qubit gate. In this example configuration the diagonal part of the Hamiltonian is degenerate in the basis states $|110\rangle, |020\rangle, |011\rangle$ or $|120\rangle, |111\rangle, |021\rangle$

| | $\hat{a}_1$ | $\hat{a}_2$ | $\hat{a}_3$ |
|---|---|---|---|
| $|0\rangle$ | 0 | 0 | 0 |
| $|1\rangle$ | $\omega_0 - \eta$ | $\omega_0$ | $\omega_0 - \eta$ |
| $|2\rangle$ | $2\omega_0 - 3\eta$ | $2\omega_0 - \eta$ | $2\omega_0 - 3\eta$ |

In the first subspace $\mathcal{H}_1$ the new energy eigenstates under this frequency parking are given by Equations (5)-(7) below.

$$|\tilde{0}\rangle = \frac{|011\rangle - |110\rangle}{\sqrt{2}}, E_0 = 0 \quad (5)$$

$$|\tilde{-}\rangle = \frac{|011\rangle + |110\rangle}{2} - \frac{|020\rangle}{\sqrt{2}}, E_- = -2g \quad (6)$$

$$|\tilde{+}\rangle = \frac{|011\rangle + |110\rangle}{2} + \frac{|020\rangle}{\sqrt{2}}, E_+ = 2g, \quad (7)$$

In Equations (5)-(7) the diagonal energy is not accounted for since the diagonal energy can be eliminated by a basis rotation and amounts to a global phase that does not affect the fidelity of the unitary transformation. Due to the specific choice of frequency parking described with reference to Table II, the states $|100\rangle$ and $|010\rangle$ are separated by a large gap $\eta$, e.g., a gap that is at least one magnitude larger than the coupling strength g. Under the assumption that $g \ll \eta$, the energy shift to the dressed state of $|100\rangle$ and $|010\rangle$ caused by nonzero coupling is suppressed. Similarly, transitions between $|010\rangle$ and $|001\rangle$ are negligible to first order. The original Fock-basis can then be expressed in the new basis given by equations (8)-(10) below.

$$|011\rangle = \frac{\frac{|\tilde{+}\rangle + |\tilde{-}\rangle}{\sqrt{2}} + |\tilde{0}\rangle}{\sqrt{2}} \quad (8)$$

$$|110\rangle = \frac{\frac{|\tilde{+}\rangle + |\tilde{-}\rangle}{\sqrt{2}} - |\tilde{0}\rangle}{\sqrt{2}} \quad (9)$$

$$|020\rangle = \frac{|\tilde{+}\rangle - |\tilde{-}\rangle}{\sqrt{2}} \quad (10)$$

Under a constant Hamiltonian evolution for time $\Delta t = \pi/(2g)$ the zero energy state $|\tilde{0}\rangle$ given by Equation (5) remains invariant, while the two other eigenstates given by Equations (6) and (7) accumulate a minus sign: $|\tilde{+}\rangle \to -|\tilde{+}\rangle$, $|\tilde{-}\rangle \to -|\tilde{-}\rangle$. In some implementations, the system is evolved for a time $\Delta t = n\pi/(2g)$, where n is an odd integer. Application of additional Pauli Z rotations $$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z}$$

cancels additional phases accumulated in the computational basis during the gate time. The basis transformation given by Equations (11) and (12) below is then obtained.

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}t} |110\rangle = \frac{-\left(\frac{|\tilde{+}\rangle + |\tilde{-}\rangle}{\sqrt{2}}\right) - |\tilde{0}\rangle}{\sqrt{2}} = -|011\rangle \quad (11)$$

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}t} |011\rangle = \frac{-\left(\frac{|\tilde{+}\rangle + |\tilde{-}\rangle}{\sqrt{2}}\right) - |\tilde{0}\rangle}{\sqrt{2}} = -|110\rangle \quad (12)$$

In the second subspace $\mathcal{H}_2$, the states $|120\rangle$, $|111\rangle$, $|021\rangle$ are degenerate and form the new eigenbasis given by Equations (13)-(15) below.

$$|\tilde{0}\rangle = \frac{|021\rangle - |120\rangle}{\sqrt{2}}, E_0 = 0 \quad (13)$$

$$|\tilde{-}\rangle = \frac{|021\rangle + |120\rangle}{2} - \frac{|111\rangle}{\sqrt{2}}, E_- = -2g \quad (14)$$

$$|\tilde{+}\rangle = \frac{|021\rangle + |120\rangle}{2} + \frac{|111\rangle}{\sqrt{2}}, E_+ = 2g, \quad (15)$$

The original Fock basis can be expressed in the new basis given by Equations (16)-(18) below.

$$|021\rangle = \frac{\frac{|\tilde{+}\rangle + |\tilde{-}\rangle}{\sqrt{2}} + |\tilde{0}\rangle}{\sqrt{2}} \quad (16)$$

$$|120\rangle = \frac{\frac{|\tilde{+}\rangle + |\tilde{-}\rangle}{\sqrt{2}} - |\tilde{0}\rangle}{\sqrt{2}} \quad (17)$$

$$|111\rangle = \frac{|\tilde{+}\rangle - |\tilde{-}\rangle}{\sqrt{2}} \quad (18)$$

Under the same Hamiltonian evolution as in Equations (10)-(11) the basis transformation given by Equation (19) is obtained.

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t} |111\rangle = \quad (19)$$

$$\frac{-|+\rangle + |-\rangle}{\sqrt{2}} = -|111\rangle$$

The transformation of the other computational basis states are given by Equations (20)-(22) below, where accumulation of diagonal phases are cancelled through application of single Pauli gates.

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t} |100\rangle = |100\rangle \quad (20)$$

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t} |001\rangle = |001\rangle \quad (21)$$

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t} |010\rangle = |010\rangle \quad (22)$$

Realization of the CSZ three-qubit entangling gate is therefore realized by evolution of the qubit Hamiltonian of Equation (1) under the frequency parking configuration described with reference to Table II, namely $$CSZ = e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t} = Fredkin(2)C\tilde{Z}\tilde{Z}CCZ \quad (23)$$

where Fredkin(2) represents a controlled swap gate with the second qubit acting as a control, $C\tilde{Z}\tilde{Z}$ represents controlled $\tilde{Z}(2)=-\sigma_2^z$ and $\tilde{Z}(3)=-\sigma_3^z$ with the first qubit acting as control, i.e., $C\tilde{Z}\tilde{Z}=\text{Control(first qubit)}\tilde{Z}(2)\tilde{Z}(3)$, and CZZ represents a controlled Z operation on the third qubit with the first and second qubit acting as a control Inhomogeneous Coupling In some implementations homogeneity of the coupling between qubits may not be experimentally realizable. For example, the coupling strength between qubits may not be tunable. In these implementations the coupling between the first and second qubit $g_1(t)$ and the coupling between the second and third qubit $g_2(t)$ is inhomogeneous, i.e., $g_1(t) \neq g_2(t)$.

When $g_1(t) \neq g_2(t)$, the coupling Hamiltonian in the basis $\vec{v} = \{v_{110}, v_{020}, v_{011}, v_{120}, v_{111}, v_{021}\}$ takes the form shown in Equation (24) below.

$$\hat{H}_{od}\begin{pmatrix} 0 & \sqrt{2}g_1 & 0 & 0 & 0 & 0 \\ \sqrt{2}g_1 & 0 & \sqrt{2}g_2 & 0 & 0 & 0 \\ 0 & \sqrt{2}g_2 & 0 & 0 & 0 & 0 \\ 0 & 0 & 0 & 0 & \sqrt{2}g_2 & 0 \\ 0 & 0 & 0 & \sqrt{2}g_2 & 0 & \sqrt{2}g_1 \\ 0 & 0 & 0 & 0 & \sqrt{2}g_1 & 0 \end{pmatrix} \quad (24)$$

$$(25)$$

In the first subspace $\mathcal{H}_1$ the new energy eigenstates are given by Equations (26)-(28) below.

$$|\tilde{0}\rangle = \frac{\cos\theta_g |011\rangle - \sin\theta_g |110\rangle}{\sqrt{2}}, E_0 = 0 \quad (26)$$

$$|\tilde{-}\rangle = \frac{\sin\theta_g |011\rangle + \cos\theta_g |110\rangle}{2} - \frac{|020\rangle}{\sqrt{2}}, E_- = -2g \quad (27)$$

$$|\tilde{+}\rangle = \frac{\sin\theta_g |011\rangle + \cos\theta_g |110\rangle}{2} + \frac{|020\rangle}{\sqrt{2}}, E_+ = 2g, \quad (28)$$

In Equations (26)-(28) tan $$\theta_g = g_2/g_1 \text{ and } g = \sqrt{\frac{g_1^2 + g_2^2}{2}}$$

represents the new energy gap. The new eigenbasis can be expanded in the Fock basis as given by Equations (29)-(31) below.

$$|011\rangle = \frac{\sin\theta_g \frac{|\tilde{+}\rangle + |\tilde{-}\rangle}{\sqrt{2}} + \cos\theta_g |\tilde{0}\rangle}{\sqrt{2}} \quad (29)$$

$$|110\rangle = \frac{\cos\theta_g \frac{|\tilde{+}\rangle + |\tilde{-}\rangle}{\sqrt{2}} - \sin\theta_g |\tilde{0}\rangle}{\sqrt{2}} \quad (30)$$

$$|020\rangle = \frac{|\tilde{+}\rangle - |\tilde{-}\rangle}{\sqrt{2}} \quad (31)$$

Under a constant Hamiltonian evolution for time $\Delta t = \pi/(2g)$ the zero energy state $|0\rangle$ remains invariant, while the two other eigenstates accumulate a minus sign: $|+\rangle \rightarrow -|+\rangle$, $|-\rangle \rightarrow |-\rangle$. In some implementations, the system is evolved for a time $\Delta t = n\pi/(2g)$ with n an odd integer. Application of additional Pauli Z rotations $$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z}$$

can be implemented to cancel additional phases accumulated in the computational basis during the gate time. The basis transformation given by Equations (32) and (33) is then obtained.

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t}|110\rangle = \quad (32)$$

$$-\frac{\left(\cos\theta_g \frac{|+\rangle + |-\rangle}{\sqrt{2}} - \sin\theta_g|0\rangle\right)}{\sqrt{2}} = -\frac{\cos\theta_g|110\rangle + \sin\theta_g|011\rangle}{\sqrt{2}}$$

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t}|011\rangle = \quad (33)$$

$$-\frac{\left(\sin\theta_g \frac{|+\rangle + |-\rangle}{\sqrt{2}} + \cos\theta_g|0\rangle\right)}{\sqrt{2}} = -\frac{\sin\theta_g|110\rangle - \cos\theta_g|011\rangle}{\sqrt{2}}$$

In the second subspace $\mathcal{H}_2$, the states $|120\rangle$, $|111\rangle$, $|021\rangle$ are degenerate and form the new eigenbasis given by Equations (34)-(36) below.

$$|\tilde{0}\rangle = \frac{\cos\theta_g|021\rangle - \sin\theta_g|120\rangle}{\sqrt{2}}, E_0 = 0 \quad (34)$$

$$|\doteq\rangle = \frac{\sin\theta_g|021\rangle + \cos\theta_g|120\rangle}{2} - \frac{|111\rangle}{\sqrt{2}}, E_- = -2g \quad (35)$$

$$|\mp\rangle = \frac{\sin\theta_g|021\rangle + \cos\theta_g|120\rangle}{2} + \frac{|111\rangle}{\sqrt{2}}, E_+ = 2g, \quad (36)$$

The original Fock basis can be expressed in the new basis given by Equation (37) below.

$$|111\rangle = \frac{|\mp\rangle - |\doteq\rangle}{\sqrt{2}} \quad (37)$$

Under the same Hamiltonian evolution as in Equations (32)-(33) the basis transformation given by Equation (38) is obtained.

$$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z} e^{-i\hat{H}\Delta t}|111\rangle = \frac{-|+\rangle + |-\rangle}{\sqrt{2}} = -|111\rangle \quad (38)$$

Since the diagonal energies remains the same, for the same reasons other computational basis states remain invariant due to the cancellation of the accumulated diagonal phase through the single Pauli gates.

The realized three qubit gate therefore induces additional rotation between the computational bases: $|110\rangle$ and $|011\rangle$ as seen in Eq. (32) and (33), and is referred to as a partial swap entangling gate $CSZ(\theta_g)$ (that depends on the ratio of the inhomogeneous coupling strengths at different qubit sites). The gate is realized by evolution of qubit Hamiltonian under the frequency parking configuration described with reference to Table. II with inhomogeneous coupling strength. That is, a single two-qubit Hamiltonian evolution under the frequency parking configuration described with reference to Table. II realizes a composite three-qubit Gate. When $\theta_g = \pi/4$ the partial swap gate $CSZ(\theta_g)$ is an exact CSZ gate. Both gates have Schmidt rank 4 and are therefore maximally entangling. The CSZ and $CSZ(\theta_g)$ gates are interchangeable up to two-qubit gates.

Example Process for Performing CSZ Three-Qubit Gate

Figure 2:
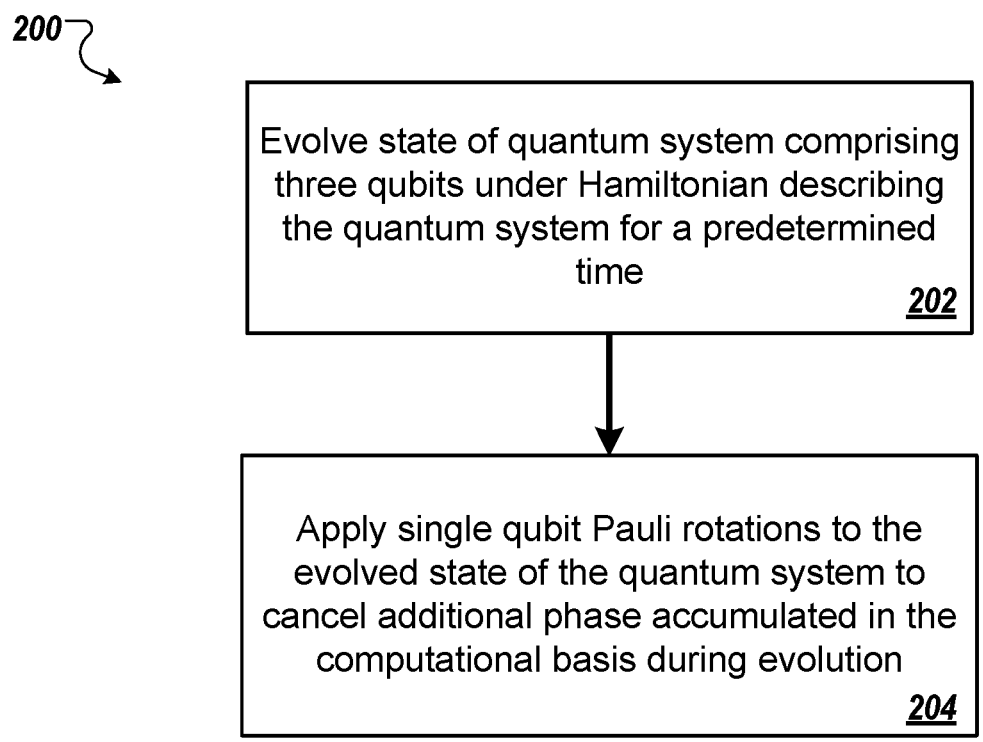
FIG. 2 is a flow chart of an example process for implementing a three-qubit quantum logic gate using local Hamiltonian control.

FIG. 2 is a flow diagram of an example process 200 for implementing a three-qubit quantum logic gate on a quantum system comprising a first qubit, second qubit and third qubit, wherein the second qubit is coupled to the first qubit and to the third qubit. For convenience, the process 200 will be described as being performed by quantum hardware in communication with control electronics located in one or more locations. For example, the system 100 of FIG. 1, appropriately programmed in accordance with this specification, can perform the process 200.

The system evolves a state of the quantum system under a Hamiltonian describing the quantum system for a predetermined time (step 202). For example, in cases where the first qubit, second qubit and third qubit are superconducting qubits, the Hamiltonian describing the quantum system may be the Hamiltonian given by Equation (1) above. The state of the quantum system may be an initial state or a current state of the quantum system, e.g., in cases where implementation of the three qubit quantum logic gate is one step of a larger computation being performed by the system.

During the evolving, that is during the evolution of the quantum system, the ground and first excited state of the second qubit are separated by a first energy gap.

The first and second excited state of the second qubit are separated by a second energy gap that is equal to a first multiple of the first energy gap minus qubit anharmoniticity. In some implementations the first multiple of the first energy gap may be approximately equal to twice or approximately close to twice the first energy gap, i.e., equal to twice the first energy gap within the limits of hardware accuracy. For example, if the intended multiple is 2 the second multiple may be equal to 2± an inherent drift or inaccuracy present in the hardware implementing the evolution, e.g., 1.98 or 2.01. In this example, over time the central tendency of the value of the second multiple may be equal to 2. The qubit anharmonicity is larger than the strength of the coupling between the first and second qubit and larger than the strength of the coupling between the second and third qubit.

The ground and first excited state of the first qubit and ground and first excited state of the third qubit are separated by a third energy gap that is approximately, i.e., within the limits of hardware accuracy as described above, equal to the first energy gap minus the qubit anharmonicity. For example, if the intended third energy gap is x, the realized third energy gap may be equal to x±an inherent drift or inaccuracy present in the hardware implementing the evolution. In this example, over time the central tendency of the value of the third energy gap may be equal to x.

The first and second excited state of the first qubit and first and second excited state of the third qubit are separated by a fourth energy gap that is approximately, i.e., equal to twice the first energy gap within the limits of hardware accuracy (as described above), equal to the first multiple of the first energy gap minus a second multiple of the qubit anharmonicity. In some implementations the second multiple of the qubit anharmonicity may be equal to approximately three times the qubit anharmonicity.

In some implementations the coupling between the second qubit and first qubit and between the second qubit and the third qubit may be homogeneous. That is, the second qubit is coupled to the first qubit and to the third qubit with approximately, i.e., within the limits of hardware accuracy (as described above), equal coupling strength. In these implementations the predetermined time is approximately equal to $\pi/2g$ where g represents homogeneous qubit coupling strength. In some implementations, the system is evolved for a time given approximately, i.e., within the limits of hardware accuracy, by $\Delta t = n\pi/(2g)$ with n an odd integer. Evolving the state of the quantum system under the Hamiltonian describing the quantum system for this predetermined time implements the CSZ three qubit gate—a swap operation is performed between the first qubit and the third qubit, the swap operation being conditioned on the second qubit being in an excited state, and a minus sign is assigned to swapped basis states.

In some implementations the coupling between the second qubit and first qubit and between the second qubit and the third qubit may be inhomogeneous. That is, the second qubit is coupled to the first qubit and to the third qubit with different coupling strengths. In these implementations the predetermined time is equal to $\pi/2_g$ with $$g = \sqrt{\frac{g_1^2 + g_2^2}{2}}$$

where $g_1$ represents coupling strength between the first qubit and second qubit, and $g_2$ represents coupling strength between the second qubit and third qubit. In some implementations, the system is evolved for a time given approximately by $\Delta t = n\pi/(2g)$ with n an odd integer. Evolving the state of the quantum system under the Hamiltonian describing the quantum system for this predetermined time implements the CSZ three qubit gate—a partial swap operation is performed between the first qubit and the third qubit, the partial swap operation being conditioned on the second qubit being in an excited state, and a minus sign is assigned to swapped basis states.

Evolving the state of the quantum system under a Hamiltonian describing the quantum system for a predetermined time produces an evolved state of the quantum system.

The system applies multiple Pauli Z rotations to the evolved state of the quantum system to cancel additional phase accumulated in the computational basis during evolution of the state of the quantum system (step 204). In some implementations applying multiple Pauli Z rotations comprises applying the operator $$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z}$$

to the evolved state of the quantum system.

Application: Reduced Circuit Depth for Non-Local Controlled Unitary

Figure 3A:
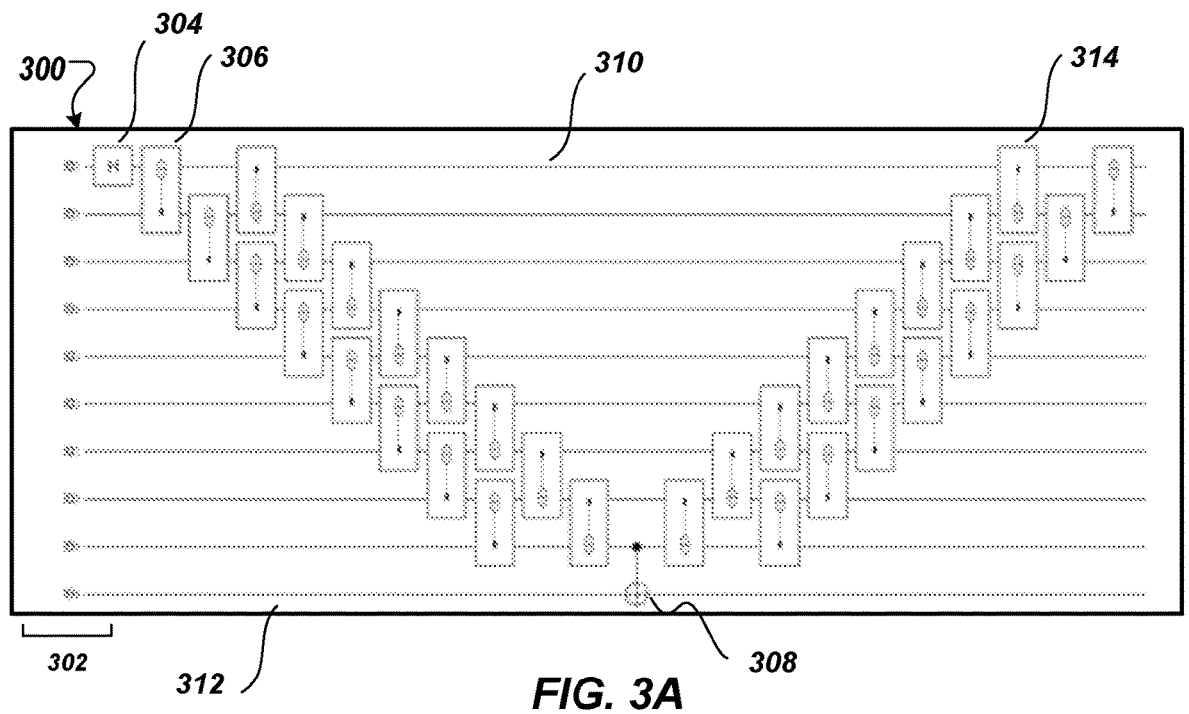
FIG. 3A shows an example circuit diagram for using two-qubit gates to perform a non-local CNOT gate between a first and tenth qubit on a linear chain.

FIG. 3A is an example circuit diagram 300 for implementing a nonlocal CNOT gate between a first and tenth qubit on a linear chain of qubits using two-qubit gates. The example circuit diagram 300 is an example implementation of a non-local CNOT gate between a first and tenth qubit using conventional methods.

The example circuit diagram 300 includes a register of 10 qubits 302. To implement the CNOT gate between the first qubit (represented by line 310) and the tenth qubit (represented by line 312), a Hadamard gate 304 is performed on the first qubit 310. This is followed by a downward cascade of two-qubit entangling gates, e.g., CNOT gate 306, between neighboring qubits. A CNOT gate 308 is then performed between the ninth qubit and tenth qubit 312. An upward cascade of two-qubit entangling gates, e.g., CNOT gate 314, between neighboring qubits is then performed.

As shown in the example circuit diagram 300, implementation of the non-local CNOT gate requires at least 2n+5=2 (10)+5=25 single and two-qubit gates. It is noted that implementation of a nonlocal CNOT gate is one of many examples—the CNOT gate 308 may be replaced by any nonlocal controlled unitary gate as desired.

Figure 3B:
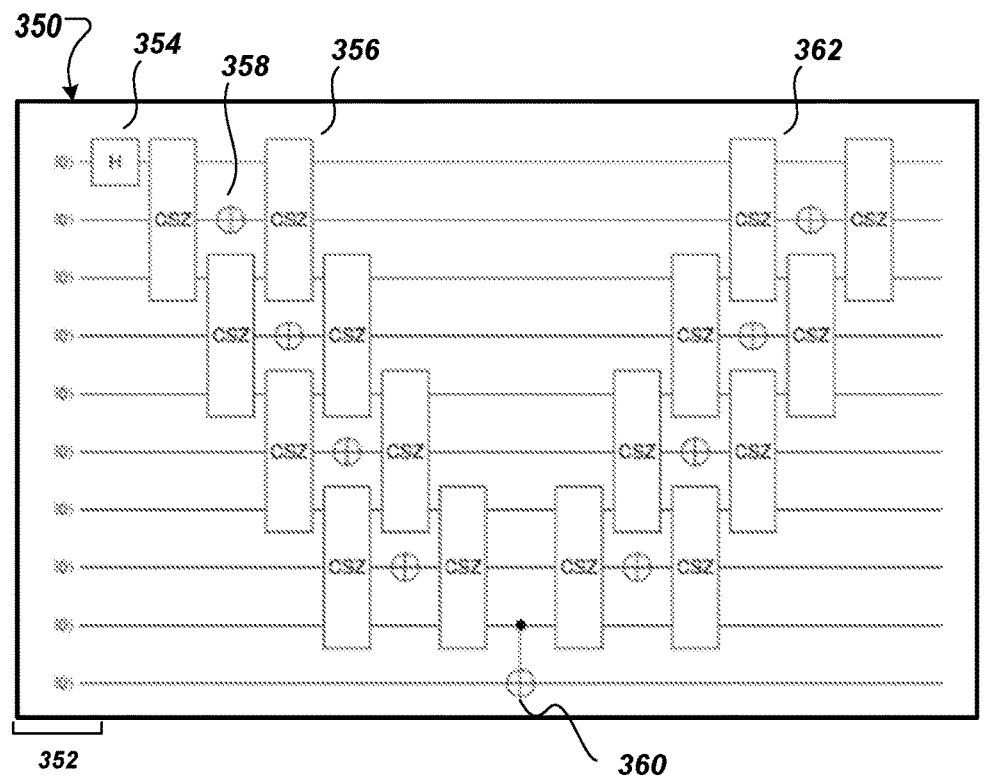
FIG. 3B shows an example circuit diagram for using a three-qubit gate implemented using two-local Hamiltonian control to perform a non-local CNOT gate between a first and tenth qubit on a linear chain.

FIG. 3B is an example circuit diagram 35000 for implementing a nonlocal CNOT gate between a first and tenth qubit on a linear chain of qubits using the presently described three-qubit gate.

The example circuit diagram 350 includes a register of 10 qubits 352. To implement the CNOT gate between the first qubit and the tenth qubit, a Hadamard gate 354 is performed on the first qubit. This is followed by a downward cascade of CSZ three-qubit entangling gates, e.g., CSZ gate 356, between neighboring qubits. A CNOT gate 360 is then performed between the ninth qubit and tenth qubit. An upward cascade of CSZ three-qubit entangling gates, e.g., CSZ gate 362, between neighboring qubits is then performed. Symbols 358 represent NOT gates that are equivalent to applying Pauli X gates that flip a |0> state to a |1> state and vice versa.

As shown in the example circuit diagram 350, implementation of the non-local CNOT gate requires fewer gates compared to the example shown in FIG. 3A. In fact, implementation of the presently described CSZ gate halves the overall circuit depth in the asymptotic limit. Again, implementation of a nonlocal CNOT gate is one of many examples—the CNOT gate 360 may be replaced by any nonlocal controlled unitary gate as desired.

Application: Reduced Circuit Depth for Quantum Supremacy Experiment

The presently described CSZ three-qubit gate can be applied in quantum supremacy experiments that use a two dimensional qubit array, e.g., quantum supremacy experiments that aim to entangle every pair of qubits in the qubit array using a smallest circuit depth as possible such that no classical computer can conveniently calculate the amplitude of each computational basis without exponential in the number of qubit computational steps. Such experiments typically use a two-qubit controlled-Z gate as an entangling gate. However, because of its higher Schmidt rank and longer range of interaction, it is advantageous to replace the Controlled-Z gates with the presently described CSZ gates.

The rank of the presently described CSZ gate can be analyzed by decomposing it into linear sum of independent Hermitian generators. Since the CSZ gate is already Hermitian, such decomposition can be given by Equation (39) below.

$$CSZ = \frac{1}{8}(\sigma_1^2\sigma_2^2\sigma_3^2 - \sigma_2^2\sigma_3^2 - \sigma_1^2\sigma_3^2 - \sigma_1^2\sigma_2^2 + \sigma_1^2 + \sigma_2^2 + \sigma_3^2 - I) - \frac{1}{4}(\sigma_1^2\sigma_3^2 - \sigma_1^2\sigma_2^2\sigma_3^2 + \sigma_1^2\sigma_3^2 - \sigma_1^2\sigma_2^2\sigma_3^2). \quad (39)$$

A given bi-partition that describes the cut across the circuit is then chosen. Due to the symmetry between qubit 1 and qubit 2, only the partition (12; 3) and partition (13; 2) must be analyzed. For the partition (12; 3), the CSZ can be expressed in the following form:

$$CSZ = \frac{1}{8}[\sigma_1^2\sigma_2^2 - \sigma_1^2 + I]\sigma_3^2 - \frac{1}{4}(\sigma_1^2 - \sigma_1^2\sigma_2^2)\sigma_3^2 + \frac{1}{4}(\sigma_1^2 - \sigma_1^2\sigma_2^2)\sigma_3^2 + \frac{1}{8}(\sigma_1^2 + \sigma_2^2 - I_1I_2 - \sigma_1^2\sigma_2^2)I_2 + \frac{1}{8}\sigma_3^2 \quad (40)$$

which contains four independent terms that can each be written as a product between one half of the system containing qubit 1 and 2, and the other half of the system. The rank of the CSZ gate across partition (12; 3) is therefore 4. For the partition (13; 2), the CSZ gate can be expressed in the following form:

$$CSZ = (\tfrac{1}{8}[\sigma_1^2\sigma_3^2 - \sigma_3^2 - \sigma_1^2 + I_1 I_2]\tfrac{1}{4}[\sigma_1^2\sigma_3^2 + \sigma_1^2\sigma_3^2])\sigma_2^2(-\tfrac{1}{4}[\sigma_1^2\sigma_3^2 + \sigma_1^2\sigma_3^2] + \tfrac{1}{8}[\sigma_1^2 + \sigma_3^2 - \sigma_1^2\sigma_3^2 - I_1 I_2])I_2 \qquad (41)$$

which contains two independent terms each can be written as a product between one half of the system containing qubit 1 and 3, and the other half of the system containing qubit 2.

Since the control qubit 2 is in the middle of the three qubits, any cut will fall into the partition of (12; 3), which always has a rank of 4.

Implementations of the subject matter and operations described in this specification can be implemented in digital electronic circuitry, analog electronic circuitry, suitable quantum circuitry or, more generally, quantum computational systems, in tangibly-embodied software or firmware, in computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable computers, operating with one or more processors, as appropriate, executing one or more computer programs to perform functions by operating on input data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions. For example, a quantum computer may receive instructions from a digital computer that, when executed by the quantum computing apparatus, cause the apparatus to perform the operations or actions.

Computers suitable for the execution of a computer program can be based on general or special purpose processors, or any other kind of central processing unit. Generally, a central processing unit will receive instructions and data from a read-only memory, a random access memory, or quantum systems suitable for transmitting quantum data, e.g. photons, or combinations thereof.

The elements of a computer include a central processing unit for performing or executing instructions and one or more memory devices for storing instructions and digital, analog, and/or quantum data. The central processing unit and the memory can be supplemented by, or incorporated in, special purpose logic circuitry or quantum simulators. Generally, a computer will also include, or be operatively coupled to receive data from or transfer data to, or both, one or more mass storage devices for storing data, e.g., magnetic, magneto-optical disks, optical disks, or quantum systems suitable for storing quantum information. However, a computer need not have such devices.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDS) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

In certain cases, some or all of the quantum and/or classical circuit elements may be implemented using, e.g., superconducting quantum and/or classical circuit elements. Fabrication of the superconducting circuit elements can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

In certain implementations, control signals for the quantum circuit elements (e.g., qubits and qubit couplers) may be provided using classical circuit elements that are electrically and/or electromagnetically coupled to the quantum circuit elements. The control signals may be provided in digital and/or analog form.

Computer-readable media suitable for storing computer program instructions and data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a computer program product that includes instructions that are stored on one or more non-transitory machine-readable storage media, and that are executable on one or more processing devices. The systems described in this specification, or portions of them, can each be implemented as an apparatus, method, or system that may include one or more processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A method for implementing a three-qubit quantum gate on a quantum system comprising a first qubit, second qubit and third qubit, wherein the second qubit is coupled to the first qubit and to the third qubit, the three qubit quantum gate implementing a full or partial swap operation between the first qubit and the third qubit, the swap operation being conditioned on the second qubit being in an excited state, and assigning a minus sign to the swapped basis states, the method comprising:
 evolving a state of the quantum system under a Hamiltonian describing the quantum system for a predetermined time, wherein during the evolving:
 the ground and first excited state of the second qubit are separated by a first energy gap;
 the first and second excited state of the second qubit are separated by a second energy gap that is equal to the first energy gap minus a qubit anharmoniticity;
 the ground and first excited state of the first qubit and ground and first excited state of the third qubit are separated by a third energy gap that is equal to the first energy gap minus the qubit anharmonicity; and
 the first and second excited state of the first qubit and first and second excited state of the third qubit are separated by a fourth energy gap that is equal to the first energy gap minus twice the qubit anharmonicity.

2. The method of claim 1, wherein the method further comprises applying multiple Pauli Z rotations to the evolved state of the quantum system to cancel additional phase accumulated in the computational basis during evolution of the state of the quantum system.

3. The method of claim 1, wherein applying multiple Pauli Z rotations comprises applying the operator $$e^{-\frac{i(\omega-\eta)\Delta t}{2}\sigma_1^z}e^{-\frac{i(\omega)\Delta t}{2}\sigma_2^z}e^{-\frac{i(\omega-\eta)\Delta t}{2}\sigma_3^z}$$

to the evolved state of the quantum system, where $\omega$ is the first energy gap, $\eta$ is the qubit anharmoniticity, $\sigma_i^z$ is a Pauli-z operator acting on the ith qubit and $\Delta t$ is the predefined period of time.

4. The method of claim 1, wherein the coupling between the first and second qubit and between the second and third qubit is homogeneous.

5. The method of claim 4, wherein the predetermined time is equal to $\pi/2g$ where g represents qubit coupling strength.

6. The method of claim 1, wherein the coupling between qubits is inhomogeneous.

7. The method of claim 6, wherein the predetermined time is equal to $\pi/2g$ with $$g = \sqrt{\frac{g_1^2 + g_2^2}{2}}$$

where $g_1$ represents coupling strength between the first qubit and second qubit, and $g_2$ represents coupling strength between the second qubit and third qubit.

8. The method of claim 1, wherein the qubit anharmonicity is more than one magnitude larger than the strength of the coupling between the first and second qubit and larger than the strength of the coupling between the second and third qubit.

9. The method of claim 1, wherein the first qubit, second qubit and third qubit comprise superconducting qubits.

10. The method of claim 9, wherein the second qubit is coupled to the first qubit and to the third qubit via inductive, capacitive or both inductive and capacitive coupling.

11. The method of claim 10, wherein nonlinear Josephson junctions are positioned between the first and second qubit and between the second and third qubit.

12. The method of claim 1, wherein the Hamiltonian describing the quantum system is given by $$\hat{H}_3 = -\frac{\eta}{2}\sum_{j=1}^{3}\hat{n}_j(\hat{n}_j - 1) + \sum_{j=1}^{3}\omega_j(t)\hat{n}_j + g_1(t)(\hat{a}_1\hat{a}_2^\dagger + \hat{a}_1^\dagger\hat{a}_2) + g_2(t)(\hat{a}_2\hat{a}_3^\dagger + \hat{a}_2^\dagger\hat{a}_3)$$

where $\eta$ represents qubit anharmonicity, $\omega_j(t)$ represents qubit frequency, g(t) represents two-qubit coupling strength, and $\hat{n}_j$ represents the occupation number of qubit i.

13. The method of claim 1, wherein the qubit anharmonicity is equal to 200 MHz.

14. The method of claim 1, wherein the strength of the coupling between the first and second qubit or between the second and third qubit takes values in the range [−5 MHz, 50 MHz].

15. The method of claim 1, wherein the first, and/or, third energy gaps take values in the range [4.0 GHz, 6.0 GHz].

16. An apparatus comprising:
 a quantum system comprising a first qubit, second qubit and third qubit, wherein the second qubit is coupled to the first qubit and to the third qubit;
 control electronics comprising:
  one or more control devices; and
  one or more control lines coupled from the one or more control devices to the quantum system;
  wherein the control electronics are configured to implement a three qubit quantum gate performing a full or partial swap operation between the first qubit and the third qubit, the swap operation being conditioned on the second qubit being in an excited state, and assigning a minus sign to the swapped basis states by evolving a state of the quantum system under a Hamiltonian describing the quantum system for a predetermined time, wherein during the evolving:
   the ground and first excited state of the second qubit are separated by a first energy gap;

the first and second excited state of the second qubit are separated by a second energy gap that is equal to the first energy gap minus a qubit anharmonicity;

the ground and first excited state of the first qubit and ground and first excited state of the third qubit are separated by a third energy gap that is equal to the first energy gap minus the qubit anharmonicity; and the first and second excited state of the first qubit and first and second excited state of the third qubit are separated by a fourth energy gap that is equal to the first energy gap minus twice the qubit anharmonicity.

17. The apparatus of claim 16, wherein the method further comprises applying multiple Pauli Z rotations to the evolved state of the quantum system to cancel additional phase accumulated in the computational basis during evolution of the state of the quantum system.

18. The apparatus of claim 17, wherein applying multiple Pauli Z rotations comprises applying the operator $$e^{-\frac{i(\omega-\eta)\Delta t}{2}\sigma_1^z} e^{-\frac{i(\omega)\Delta t}{2}\sigma_2^z} e^{-\frac{i(\omega-\eta)\Delta t}{2}\sigma_3^z}$$

to the evolved state of the quantum system, where $\omega$ is the first energy gap, $\eta$ is the qubit anharmoniticity, $\sigma_i^z$ is a Pauli-z operator acting on the ith qubit and $\Delta t$ is the predefined period of time.

19. The apparatus of claim 16, wherein the coupling between the first and second qubit and between the second and third qubit is homogeneous.

20. The apparatus of claim 19, wherein the predetermined time is equal to $\pi/2g$ where g represents qubit coupling strength.

21. The apparatus of claim 16, wherein the coupling between qubits is inhomogeneous.

22. The apparatus of claim 21, wherein the predetermined time is equal to $\pi/2g$ with $$g = \sqrt{\frac{g_1^2 + g_2^2}{2}}$$

where $g_1$ represents coupling strength between the first qubit and second qubit, and $g_2$ represents coupling strength between the second qubit and third qubit.

23. The apparatus of claim 16, wherein the qubit anharmonicity is more than one magnitude larger than the strength of the coupling between the first and second qubit and larger than the strength of the coupling between the second and third qubit.

24. The apparatus of claim 16, wherein the first qubit, second qubit and third qubit comprise superconducting qubits.

25. The apparatus of claim 24, wherein the second qubit is coupled to the first qubit and to the third qubit via inductive, capacitive or both inductive and capacitive coupling.

26. The apparatus of claim 25, wherein nonlinear Josephson junctions are positioned between the first and second qubit and between the second and third qubit.

27. The apparatus of claim 16, wherein the Hamiltonian describing the quantum system is given by $$\hat{H}_3 = -\frac{\eta}{2}\sum_{j=1}^{3} \hat{n}_j(\hat{n}_j - 1) + \sum_{j=1}^{3} \omega_j(t)\hat{n}_j + g_1(t)(\hat{a}_1\hat{a}_2^\dagger + \hat{a}_1^\dagger\hat{a}_2) + g_2(t)(\hat{a}_2\hat{a}_3^\dagger + \hat{a}_2^\dagger\hat{a}_3)$$

where $\eta$ represents qubit anharmonicity, $\omega_j(t)$ represents qubit frequency, and g(t) represents two-qubit coupling strength, and $\hat{n}_j$ represents the occupation number of qubit i.

28. The apparatus of claim 16, wherein the qubit anharmonicity is equal to 200 MHz.

29. The apparatus of claim 16, wherein the strength of the coupling between the first and second qubit or between the second and third qubit takes values in the range [−5 MHz, 50 MHz].

30. The apparatus of claim 16, wherein the first, and/or third energy gaps take values in the range [4.0 GHz, 6.0 GHz].

* * * * *